US011499070B2

(12) United States Patent
Ashitaka et al.

(10) Patent No.: US 11,499,070 B2
(45) Date of Patent: Nov. 15, 2022

(54) MODIFIED COLLOIDAL SILICA AND METHOD FOR PRODUCING THE SAME, AND POLISHING AGENT USING THE SAME

(71) Applicant: FUJIMI INCORPORATED, Kiyosu (JP)

(72) Inventors: Keiji Ashitaka, Kiyosu (JP); Shogo Tsubota, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 409 days.

(21) Appl. No.: 15/544,389

(22) PCT Filed: Jan. 19, 2016

(86) PCT No.: PCT/JP2016/051442
§ 371 (c)(1),
(2) Date: Jul. 18, 2017

(87) PCT Pub. No.: WO2016/117560
PCT Pub. Date: Jul. 28, 2016

(65) Prior Publication Data
US 2017/0362465 A1 Dec. 21, 2017

(30) Foreign Application Priority Data
Jan. 19, 2015 (JP) .............................. JP2015-008049

(51) Int. Cl.
*C09G 1/02* (2006.01)
*B24B 37/00* (2012.01)
(Continued)

(52) U.S. Cl.
CPC ................ *C09G 1/02* (2013.01); *B24B 37/00* (2013.01); *B24B 37/044* (2013.01);
(Continued)

(58) Field of Classification Search
CPC ......... C09G 1/02; B24B 37/00; B24B 37/044; C01B 33/146; C01B 33/148;
(Continued)

(56) References Cited

U.S. PATENT DOCUMENTS

| 4,842,837 A | 6/1989 | Shimizu et al. |
| 2004/0127147 A1* | 7/2004 | Suenaga .............. C09K 3/1409 451/36 |

(Continued)

FOREIGN PATENT DOCUMENTS

| CN | 1513931 A | 7/2004 |
| CN | 103180101 A | 6/2013 |

(Continued)

OTHER PUBLICATIONS

Extended European Search Report dated Dec. 20, 2017 issued in corresponding application No. 16 740 167.

(Continued)

*Primary Examiner* — Robert S Jones, Jr.
*Assistant Examiner* — Jiangtian Xu
(74) *Attorney, Agent, or Firm* — Foley & Lardner LLP

(57) ABSTRACT

To provide modified colloidal silica capable of improving the stability of the polishing speed with time when used as abrasive grains in a polishing composition for polishing a polishing object that contains a material to which charged modified colloidal silica easily adheres, such as a SiN wafer, and to provide a method for producing the modified colloidal silica. Modified colloidal silica, being obtained by modifying raw colloidal silica, wherein the raw colloidal silica has a number distribution ratio of 10% or less of microparticles having a particle size of 40% or less relative to a volume average particle size based on Heywood diameter (equivalent circle diameter) as determined by image analysis using a scanning electron microscope.

8 Claims, 3 Drawing Sheets

(51) Int. Cl.

| | | |
|---|---|---|
| *C01B 33/146* | (2006.01) | |
| *C09K 3/14* | (2006.01) | |
| *H01L 21/304* | (2006.01) | |
| *B24B 37/04* | (2012.01) | |
| *C01B 33/148* | (2006.01) | |
| *C01B 33/149* | (2006.01) | |
| *C07F 7/02* | (2006.01) | |
| *H01L 21/3105* | (2006.01) | |
| *H01L 21/768* | (2006.01) | |

(52) U.S. Cl.
CPC .......... *C01B 33/146* (2013.01); *C01B 33/148* (2013.01); *C01B 33/149* (2013.01); *C07F 7/025* (2013.01); *C09K 3/14* (2013.01); *C09K 3/1436* (2013.01); *H01L 21/304* (2013.01); *H01L 21/31053* (2013.01); *C01P 2004/03* (2013.01); *C01P 2004/51* (2013.01); *C01P 2004/61* (2013.01); *H01L 21/76819* (2013.01)

(58) Field of Classification Search
CPC .......... C01B 33/149; C07F 7/025; C09K 3/14; C09K 3/1436; H01L 21/304; H01L 21/31053; H01L 21/76819; C01P 2004/03; C01P 2004/51; C01P 2004/61
See application file for complete search history.

(56) References Cited

U.S. PATENT DOCUMENTS

| | | | |
|---|---|---|---|
| 2010/0181525 A1† | 7/2010 | Belmont | |
| 2013/0146804 A1* | 6/2013 | Mizuno ............. | H01L 21/31053 252/79.1 |
| 2013/0158009 A1 | 6/2013 | Aicher et al. | |
| 2014/0251950 A1 | 9/2014 | Yoshizki et al. | |
| 2014/0308155 A1 | 10/2014 | Morinaga et al. | |
| 2014/0349484 A1 | 11/2014 | Yokota et al. | |
| 2016/0222254 A1* | 8/2016 | Huang ................ | H01L 21/3212 |
| 2016/0293436 A1 | 10/2016 | Yokota et al. | |
| 2017/0342304 A1* | 11/2017 | Ashitaka ............... | B24B 37/044 |
| 2017/0362465 A1* | 12/2017 | Ashitaka ................ | B24B 37/00 |
| 2019/0144728 A1* | 5/2019 | Ashitaka ............... | B24B 37/044 |

FOREIGN PATENT DOCUMENTS

| | | | |
|---|---|---|---|
| GB | 2 397 068 | | 7/2004 |
| JP | 63-074911 A | | 4/1988 |
| JP | 10-204052 A | | 8/1998 |
| JP | H10-204052 A | † | 8/1998 |
| JP | 2004-204151 A | | 7/2004 |
| JP | 2005-060217 A | | 3/2005 |
| JP | 2005-162533 A | | 6/2005 |
| JP | 2005-162533 A | † | 6/2005 |
| JP | 2009-172709 A | | 8/2009 |
| JP | 2010-269985 A | | 12/2010 |
| JP | 2010-269985 A | † | 12/2010 |
| JP | 2012-040671 A | | 3/2012 |
| JP | 2013-041992 A | | 2/2013 |
| WO | WO-2014/077104 A1 | | 5/2014 |

OTHER PUBLICATIONS

Office Action dated Feb. 2, 2019 in the corresponding Chinese Patent Application No. 201680006420.8 with its English translation.
Office Action received in corresponding Taiwan Patent Application No. 105101552, dated Mar. 27, 2019.
Office Action received in corresponding Japanese Patent Application No. 2016-570655, dated Jul. 2, 2019.
Oh et al.; "Synthesis of Super-hydrophilic Mesoporous Silica via a Sulfonation Route", J. Ind. Eng. Chem., vol. 12, No. 6, (2006), pp. 911-917.
Taiwanese Office Action issued on Application No. 105101553, dated Dec. 12, 2019.
Non-Final Office Action on U.S. Appl. No. 15/544,425 dated Dec. 5, 2019.
Notice of Allowance on U.S. Appl. No. 16/245,030 dated Nov. 19, 2019.
Taiwanese Office Action issued on Application No. 108122957, dated Oct. 1, 2019.
Fierro et al. "Sulfonic acid-functionalized silica through quantitative oxidation of thiol groups", Chem. Commun., 2003, published in Dec. 2002, pp. 246-247.
Final Office Action on U.S. Appl. No. 15/544,425 dated Aug. 2, 2018.
Final Office Action on U.S. Appl. No. 15/544,425 dated Oct. 9, 2019.
International Preliminary Report on Patentability issued on Japanese Application No. 2016051440, dated Aug. 3, 2017.
Japanese Office Action issued on Application No. 2016-570654, dated Oct. 1, 2019.
Non-Final Office Action on U.S. Appl. No. 15/544,425 dated Jan. 24, 2019.
Non-Final Office Action on U.S. Appl. No. 16/245,030 dated May 23, 2019.
Notice of Allowance on U.S. Appl. No. 16/245,030 dated Aug. 29, 2019.
Office Action issued in Chinese Application No. 201680006419.5 dated Jul. 3, 2018.
Office Action issued on Chinese Application No. 201680006420.8, dated Sep. 25, 2019.
Office Action received in corresponding Chinese Patent Application No. 201680006419. 5, dated May 7, 2019.
Taikei, G., "CMP Technology Compendium: A Library of CMP Planarization Technology and Application," CMP, 2006, Japan, 6 pages.
US Office Action on U.S. Appl. No. 15/544,425 dated Jan. 19, 2018.
Office Action issued in Taiwanese Patent Application No. 108122957 dated Apr. 21, 2020 with English translation.
Office Action issued in Taiwanese Patent Application No. 105101553 dated Jun. 2, 2020 with English translation.
Office Action issued in corresponding European Patent Application No. 16740167.8 dated Jul. 3, 2020.
Office Action issued in corresponding Chinese Patent Application No. 201680006420.8 dated Jun. 3, 2020 with English translation.
Office Action issued in corresponding Japanese Patent Application No. 2020-005374 dated Dec. 15, 2020 with English translation.
Office Action issued in corresponding Chinese Patent Application No. 2021011202392280, dated Jan. 15, 2021 with English translation.
Office Action received in corresponding Taiwanese Patent Application No. 105101552 dated Sep. 3, 2019, with English translation.
US Office Action on U.S. Appl. No. 16/448,992 dated May 18, 2021 (with U.S. Pat. No. 10,570,322-B2, 2003/0068893-A1, and Translation of JP 2013-041992 to Tomohisa et al. Obtained from ESPACENET on May 13, 2021).
Non-Final Office Action on U.S. Appl. No. 16/449,011 dated Jun. 15, 2021 (with USP 2019/0309190-A1, 2019/0309191-A1, and 2020/0308009-A1).
Chinese Office Action issued for Chinese Application No. 201910639130.2 dated Apr. 24, 2022.
KR Office Action on non-Foley case related to U.S. Appl. No. 16/448,992 dated Aug. 19, 2022 (17 pages).
US Notice of Allowance on U.S. Appl. No. 16/448,992 dated Sep. 9, 2022 (9 pages).
Author: Masatoshi Sakai; Title: CMP Gijutu Taikei, A Library of CMP Planarization Technology and Application; pp. 3 pages (unnumbered); Publication date: Jun. 20, 2006; Publisher: Globalnet Co., Ltd.; Place of publication: Japan.†

\* cited by examiner
† cited by third party

MODIFIED COLLOIDAL SILICA AND METHOD FOR PRODUCING THE SAME, AND POLISHING AGENT USING THE SAME

TECHNICAL FIELD

The present invention relates to modified colloidal silica and a method for producing the same, and a polishing agent using the same.

BACKGROUND ART

In a semiconductor device production process, as the performance of a semiconductor device is improved, techniques for producing the wiring with higher density and higher integration are required. In a production process of such a semiconductor device, chemical mechanical polishing (CMP) is an essential process. As the miniaturization of the semiconductor circuit progresses, it is demanded to realize the high flatness required for the unevenness of a pattern wafer and also to realize the high smoothness of nano order by CMP. In order to realize the high smoothness by CMP, it is preferred that the convex portion of the pattern wafer is polished at a high polishing speed but the concave portion is not polished so much.

Herein, for example, in a case of using a pattern wafer made of a silicon nitride film (SiN film), since the silicon nitride film usually has unevenness, when polishing such a material, not only the convex portions but also the concave portions are scraped together, and the unevenness are hardly sufficiently eliminated.

In addition, the semiconductor wafer is constituted of dissimilar materials including polycrystalline silicon forming a circuit, silicon oxide being an insulating material, and silicon nitride for protecting a silicon dioxide surface that is not part of the trench or the via from the damages during etching. Therefore, a phenomenon such as dishing, in which a material that is relatively soft and easily reacts with a polishing agent, such as polycrystalline silicon, and silicon oxide is scraped excessively as compared with the silicon nitride or the like surrounding the material, is caused, and unevenness is left.

In view of the above, in a polishing process of a pattern wafer made of a hard and chemically stable material such as silicon nitride, it is required to sufficiently eliminate the unevenness.

As a technique to respond to the requirement, for example, in JP 2012-040671 A, for the purpose of providing a polishing composition capable of polishing at a high speed a polishing object that is poor in chemical reactivity, such as silicon nitride, a technique in which colloidal silica (sulfonic acid group (anionic) modified colloidal silica) obtained by immobilizing an organic acid is contained in a composition as abrasive grains, and the pH of the composition is 6 or less has been disclosed.

Herein, in general, there is a problem that silica sol such as colloidal silica is unstable because silica particles aggregate with each other under an acidic condition. As a technique to solve such a stability problem, in JP 2010-269985 A, sulfonic acid-modified aqueous anionic sol having a zeta potential of −15 mV or less at an acidic of pH 2 or more has been disclosed. In addition, in JP 2010-269985 A, as a method for producing the anionic sol described above, a technique in which a silane coupling agent having a functional group chemically convertible to a sulfonic acid group (for example, a mercapto group) is added to colloidal silica, and then the functional group is converted to a sulfonic acid group has been disclosed. Herein, in Examples of JP 2010-269985 A, silica sol containing water and methanol as a dispersing medium is heated and concentrated under alkaline and normal pressure conditions, and then into the silica sol, a mercapto group-containing silane coupling agent (3-mercaptopropyl trimethoxysilane) is added, and the resultant mixture is refluxed at a boiling point and heat aged. Next, methanol and ammonia are replaced with water, and the resultant mixture is cooled down to room temperature when the pH becomes 8 or less, and into the cooled mixture, hydrogen peroxide water is added, the mercapto group is converted to a sulfonic acid group by heating the mixture, as a result, anionic silica sol of which the surface has been modified with a sulfonic acid group is obtained.

In addition, in JP 2013-41992 A, there is a disclosure about the production of similar sulfonic acid-modified aqueous anionic silica sol, referring to the above-described JP 2010-269985 A, and J. Ind. Eng. Chem., Vol. 12, No. 6 (2006) 911-917. Herein, in Examples of JP 2013-41992 A, into an aqueous solution of the mercapto group-containing silane coupling agent similar to that as described above (under an acidic condition with acetic acid), silica sol containing water as a dispersing medium is added, the resultant mixture is stirred at room temperature for one hour, and then into the mixture hydrogen peroxide water is added, and the resultant mixture is left to stand at room temperature for 48 hours, as a result, sulfonic acid-modified aqueous anionic silica sol is obtained.

SUMMARY OF INVENTION

In performing the technique described in JP 2012-040671 A, the present inventors tried to use the modified colloidal silica produced by the method described in JP 2010-269985 A and JP 2013-41992 A. As a result, it was found that there is a problem that when a SiN wafer is polished by using a polishing composition containing anionic modified colloidal silica that has been produced by using the techniques described in these conventional arts, the ratio of the polishing rates of SiN to tetraethyl orthosilicate (TEOS) or polycrystalline silicon (poly-Si) fluctuates over time.

Accordingly, an object of the present invention is to provide modified colloidal silica capable of improving the stability of the polishing speed with time when used as abrasive grains in a polishing composition for polishing a polishing object that contains a material to which charged modified colloidal silica easily adheres, such as a SiN wafer, and to provide a method for producing the modified colloidal silica.

To solve the problem described above, the present inventors carried out intensive studies. As a result, it was found that by performing a modification treatment using, colloidal silica in which the amount of the microparticles has been reduced as raw colloidal silica, modified colloidal silica is obtained, and thus the modified colloidal silica which can solve the above-described problems can be obtained. Based on the above findings, the present inventors thus have completed the present invention.

That is, according to an aspect, there is provided modified colloidal silica, being obtained by modifying raw colloidal silica, wherein the raw colloidal silica has a number distribution ratio of 10% or less of microparticles having a particle size of 40% or less relative to a volume average particle size based on Heywood diameter (equivalent circle diameter) as determined by image analysis using a scanning electron microscope.

Furthermore, according to another aspect, there is provided a method for producing modified colloidal silica, including the steps of:

distilling off an organic solvent coexisting with colloidal silica in colloidal silica having an organic solvent concentration of 1% by mass or more under a condition of pH 7 or more so that a residual organic solvent concentration is less than 1% by mass to obtain raw colloidal silica; and modifying the raw colloidal silica to obtain modified colloidal silica.

According to the modified colloidal silica and method for producing the same according to the present invention, in a polishing composition for polishing a polishing object that contains a material to which charged modified colloidal silica easily adheres, such as a SiN wafer, when the modified colloidal silica is used as abrasive grains, the stability of the polishing speed with time can be improved.

DESCRIPTION OF EMBODIMENTS

Figure 1:
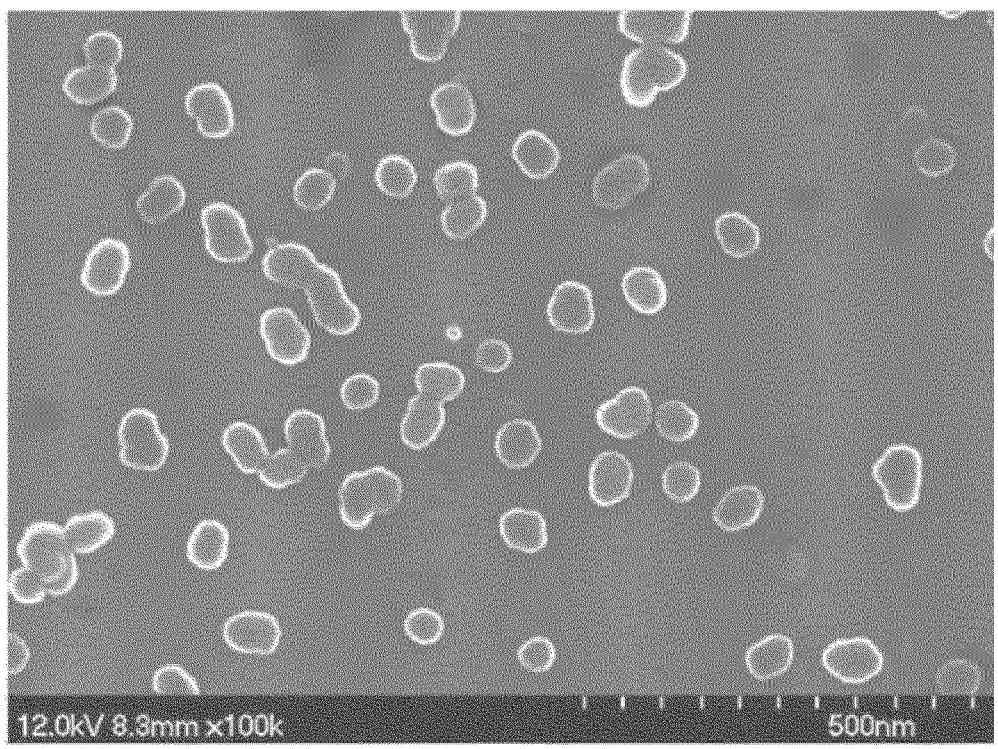
FIG. 1 is a picture of sulfonic acid-modified colloidal silica obtained in Example 1, observed with a scanning electron microscope (SEM) (magnification: 100000 times).

Hereinafter, the embodiment for carrying out the present invention will be described in detail.

An embodiment of the present invention is modified colloidal silica obtained by modifying raw colloidal silica having a number distribution ratio of 10% or less of microparticles having a particle size of 40% or less relative to a volume average particle size based on Heywood diameter (equivalent circle diameter) as determined by image analysis using a scanning electron microscope. In addition, in the present specification, the expression "obtained by modifying raw colloidal silica" means a state in which a modifying group is bonded to a surface of particles of raw colloidal silica. For example, in a case of the expression "obtained by anionically modifying raw colloidal silica", means a state in which an anionic group (for example, a sulfonic acid group) is bonded to a surface of particles of raw colloidal silica, and in a case of the expression "obtained by cationically modifying raw colloidal silica", means a state in which a cationic group (for example, an amino group or a quaternary cationic group) is bonded to a surface of particles of raw colloidal silica.

[Raw Colloidal Silica]

The raw colloidal silica can be, for example, colloidal silica produced by a sol-gel method. The raw colloidal silica produced by a sol-gel method is preferred because the content of diffusible metal impurities and the content of corrosive ions such as chloride ions in a semiconductor are small. The production of the raw colloidal silica by a sol-gel method can be performed by using a conventionally known technique, specifically, by using a hydrolyzable silicon compound (for example, an alkoxysilane or a derivative thereof) as a raw material, hydrolysis and condensation reaction is performed, as a result of which the raw colloidal silica can be obtained. The silicon compound may be used singly alone, or may also be used in combination of two or more kinds thereof. Further, the raw colloidal silica may also be the one produced by a method other than the sol-gel method.

In an embodiment, the silicon compound is preferably an alkoxysilane represented by the following general formula (1) or a derivative thereof.

$$Si(OR)_4 \qquad (1)$$

In the general formula (1), R is an alkyl group, preferably a lower alkyl group having 1 to 8 carbon atoms, and more preferably a lower alkyl group having 1 to 4 carbon atoms. Herein, examples of the R include methyl group, ethyl group, propyl group, isopropyl group, butyl group, pentyl group, and hexyl group, and tetramethoxysilane in which R is methyl group, tetraethoxysilane in which R is ethyl group, and tetraisopropoxysilane in which R is isopropyl group are preferred. Further, as the derivative of the alkoxysilane, a low condensate obtained by partially hydrolyzing the alkoxysilane is exemplified. In the present invention, it is preferred to use tetramethoxysilane from the point that it is easy to control the hydrolysis rate, the point that fine silica particles of single nm can be easily obtained, and the point that unreacted residues are less.

The silicon compound is hydrolyzed and condensed in a reaction solvent, and becomes colloidal silica. As the reaction solvent, water or an organic solvent containing water can be used. Examples of the organic solvent include a hydrophilic organic solvent including alcohols such as methanol, ethanol, isopropanol, n-butanol, t-butanol, pentanol, ethylene glycol, propylene glycol, and 1,4-butanediol; ketones such as acetone, and methyl ethyl ketone; and the like. Among these organic solvents, it is particularly preferred to use alcohols such as methanol, ethanol, and isopropanol, and from the viewpoint of the post-processing of the reaction solvent, and the like, it is more preferred to use alcohols (for example, methanol to tetramethoxysilane) having the same alkyl group as the alkyl group (R) of the raw silicon compound. These organic solvents may be used singly alone, or may also be used in combination of two or more kinds thereof. The use amount of the organic solvent is not particularly limited, but is preferably around 5 to 50 mol per 1 mol of the silicon compound. When the use amount is 5 mol or more, the sufficient compatibility with the silicon compound is ensured, and when the use amount is 50 mol or less, the decrease in the production efficiency is suppressed. The amount of the water to be added into the organic solvent is not particularly limited, as long as the amount required for the hydrolysis of the silicon compound is contained, and around 2 to 15 mol per 1 mol of the silicon compound is preferred. In addition, the amount of the water to be mixed in the organic solvent largely affects the particle size of the colloidal silica to be formed. By increasing the addition amount of water, the particle size of the colloidal silica can be increased. By decreasing the addition amount of water, the particle size of the colloidal silica can be reduced. Accordingly, by changing the mixing ratio of the water and the organic solvent, the particle size of the colloidal silica to be produced can be arbitrarily adjusted.

It is preferred to adjust the reaction solvent to alkaline by adding a basic catalyst to the reaction solvent of the hydrolysis condensation reaction of the silicon compound to obtain colloidal silica (Stober method). Accordingly, the reaction solvent is adjusted to preferably pH 8 to 11, and more preferably to pH 8.5 to 10.5, and the colloidal silica can be rapidly formed. As the basic catalyst, organic amine and ammonia are preferred from the viewpoint of preventing the contamination of impurities, in particular, ethylenediamine, diethylenetriamine, triethylenetetramine, ammonia, urea, ethanol amine, tetramethylammonium hydroxide, and the like can be preferably mentioned.

In order to hydrolyze and condense the silicon compound in the reaction solvent, the silicon compound that is a raw material is added to an organic solvent, and the resultant mixture is stirred at a temperature condition of 0 to 100° C., and preferably 0 to 50° C. By hydrolyzing and condensing the silicon compound while stirring the silicon compound in an organic solvent containing water, colloidal silica having a uniform particle size can be obtained.

As described above, the modified colloidal silica according to the present embodiment is also obtained in the similar manner as the technique described in JP 2010-269985 A, by subjecting the raw colloidal silica produced by a sol-gel method as in the above to a modification treatment. However, according to the present embodiment, in the point of using as the raw colloidal silica the one in which the amount of the microparticles has been reduced, an improvement has been made to the technique described in JP 2010-269985 A. Specifically, the modified colloidal silica according to the present embodiment is characterized by being obtained by modifying the raw colloidal silica having a number distribution ratio of 10% or less of the microparticles having a particle size of 40% or less relative to a volume average particle size (hereinafter, also simply referred to as "microparticles") based on Heywood diameter (equivalent circle diameter) as determined by image analysis using a scanning electron microscope. The number distribution ratio is preferably 5% or less, more preferably 2% or less, furthermore preferably 1% or less, still more preferably 0.5% or less, particularly preferably 0.3% or less, and most preferably 0.2% or less. From the viewpoint of obtaining action effects of the present invention, the smaller the number distribution ratio of the microparticles is, the more preferred it is, therefore, the lower limit value of the number distribution ratio is not particularly limited, but is, for example, 0.001% or more. In addition, the method for measuring the number distribution ratio is performed in accordance with the description in Examples described later.

There is no particular limitation on the specific technique for adjusting the number distribution ratio of the microparticles contained in the raw colloidal silica to 10% or less, and conventionally known knowledge can be appropriately referred. As an example of such a technique, in a case where the concentration of the organic solvent in the colloidal silica produced by the above-described hydrolysis and condensation reaction (sol-gel method) is 1% by mass or more, a method for removing the organic solvent coexisting with the colloidal silica can be mentioned so that the residual organic solvent concentration in the colloidal silica is less than 1% by mass. Herein, the expression "whether or not the residual organic solvent concentration in the colloidal silica is less than 1% by mass" is synonymous with the expression "whether or not the organic solvent is detected in the colloidal silica" in the method for measuring the organic solvent concentration (methanol concentration in Examples) using the gas chromatography that is described in Examples described later. That is, the above-described expression "so that the residual organic solvent concentration in the colloidal silica is less than 1% by mass" can also be paraphrased as the expression "so that the organic solvent in the colloidal silica measured by the measurement method described in the Examples using the gas chromatography, is lower than the detection limit".

As described above, by decreasing the concentration of the organic solvent contained in the colloidal silica, the amount of the microparticles contained in the raw colloidal silica can be decreased. At this time, as the amount of the organic solvent contained in the colloidal silica is decreased, the amount of the microparticles contained in the raw colloidal silica can be decreased. In addition, the organic solvent concentration in the colloidal silica obtained by the above-described Stober method usually exceeds 1% by mass. Therefore, according to another embodiment of the present invention, a method for producing modified colloidal silica, in which through a step of removing the organic solvent coexisting with the colloidal silica in the colloidal silica having the residual organic solvent concentration of 1% by mass or more such as the colloidal silica obtained by a Stober method, so that the residual organic solvent concentration, is 1% by mass or less, raw colloidal silica is obtained, and then modified colloidal silica is obtained by modifying the raw colloidal silica, is also provided.

As the technique for removing the organic solvent coexisting with the colloidal silica, a method in which a dispersion (silica sol) of colloidal silica is heated and the organic solvent is distilled off can be mentioned. At this time, by replacing the organic solvent to be removed with water, the liquid amount of the colloidal silica dispersion can be maintained. In addition, the pH of the colloidal silica dispersion at the time of distilling off the organic solvent is preferably pH 7 or more. As a result, there is an advantage that together with the distillation of the organic solvent, the microparticles can also be incorporated on surfaces of the main particles of colloidal silica by Ostwald ripening, and the amount of the microparticles can further be decreased.

In the above description, as the technique for adjusting the number distribution ratio of the microparticles contained in the raw colloidal silica to 10% or less, a method for removing the organic solvent coexisting with the colloidal silica has been explained in detail as an example, but by a technique different from this, the number distribution ratio of the microparticles contained in the raw colloidal silica may be set to 10% or less. As such a technique, for example, a technique of using oligomers as a raw material, a technique of optimizing the composition at the time of synthesis, a technique of performing a high temperature and pressure treatment after synthesis, a technique of performing centrifugation after synthesis, and the like can be mentioned, and a technique other than these techniques may also be used of course.

[Modification Treatment]

As described above, the modified colloidal silica according to the present embodiment can be obtained by subjecting the raw colloidal silica produced by a sol-gel method to a modification treatment, but the specific embodiment of the modification treatment is not particularly limited, and among the conventionally known modification treatments of colloidal silica, a treatment capable of subjecting the colloidal silica to anionic modification or cationic modification can be appropriately used.

(Anionically-Modified Colloidal Silica)

In the following, as one preferred embodiment of the modification treatment, an example of a technique for obtaining anionically-modified modified colloidal silica by modifying the raw colloidal silica with a sulfonic acid group will be described. In this technique, the modification step includes a first reaction step of heating the raw colloidal silica in the presence of a silane coupling agent having a functional group chemically convertible to a sulfonic acid group to obtain a reactant by, and a second reaction step of treating the reactant to convert the functional group to a sulfonic acid group.

(First Reaction Step)

In the first reaction step, the raw colloidal silica is heated in the presence of a silane coupling agent having a functional group chemically convertible to a sulfonic acid group. As a result, a reactant (in which a silane coupling agent having a functional group chemically convertible to a sulfonic acid group is bonded to surfaces of silica particles) can be obtained.

Herein, as needed, before the first reaction step, various treatment steps may be applied to the raw colloidal silica obtained in the above procedure. As such a treatment step, for example, a step of lowering the viscosity of the raw colloidal silica can be mentioned. As the step of lowering the viscosity of the raw colloidal silica, for example, a step of adding an alkaline solution (aqueous solution of various bases, such as ammonia water) or an organic solvent to the raw colloidal silica can be mentioned. The amount of the alkaline solution or organic solvent to be added at this time is not particularly limited, and may be appropriately adjusted in consideration of the viscosity of the raw colloidal silica to be obtained after the addition. As described above, by performing the step of lowering the viscosity of the raw colloidal silica, there is an advantage that the initial dispersibility of a coupling agent to colloidal silica is improved and the aggregation of silica particles can be suppressed.

In the first reaction step, as described above, the raw colloidal silica having a small content of microparticles is heated in the presence of a silane coupling agent having a functional group chemically convertible to a sulfonic acid group. As a result, a reactant can be obtained. As described above, the reason why the silane coupling agent having a functional group different from a sulfonic acid group is reacted with the raw colloidal silica, and then the functional group is converted to a sulfonic acid group (the second reaction step described later) is because in general, it is difficult to stably obtain a silane coupling agent in a form of being replaced with sulfonic acid groups.

As the silane coupling agent having a functional group chemically convertible to a sulfonic acid group, for example, 1) a silane coupling agent having a sulfonic acid ester group convertible to a sulfonic acid group by hydrolysis, and 2) a silane coupling agent having a mercapto group and/or a sulfide group convertible to a sulfonic acid group by oxidation can be mentioned. In addition, since the sulfonic acid modification on the colloidal silica surface is performed in a solution, in order to increase the modification efficiency, it is preferred to use the latter coupling agent having a mercapto group and/or a sulfide group.

Examples of the silane coupling agent having a mercapto group include 3-mercaptopropyl trimethoxysilane, 2-mercaptopropyl triethoxysilane, 2-mercaptoethyl trimethoxysilane, and 2-mercaptoethyl triethoxysilane. Further, as the coupling agent having a sulfide group, for example, bis(3-triethoxysilylpropyl)disulfide, or the like can be mentioned.

Further, the silane coupling agent is hydrolyzed in advance with an acid, and then the condensation reaction to the raw colloidal silica may also be performed.

As described above, as the technique for adjusting the number distribution ratio of the microparticles contained in the raw colloidal silica to 10% or less, in a case of employing a method for removing the organic solvent coexisting with colloidal silica, the raw colloidal silica substantially does not contain the organic solvent, and the dispersing medium of the raw colloidal silica is substantially composed of water. On the other hand, since the silane coupling agent is hardly dissolved in water, for the purpose of dissolving the silane coupling agent, a certain amount or more of an organic solvent (hydrophilic solvent) is preferably used. As such an organic solvent (hydrophilic solvent), for example, the above-described organic solvents such as methanol, ethanol, and isopropanol can be exemplified. Among them, it is preferred to use the same kind of alcohol as the alcohol produced by the above-described hydrolysis of silicon compound. This is because the recovery and reuse of the solvent can be facilitated by using the same kind of alcohol as the alcohol produced by the hydrolysis of silicon compound. Further, such an organic solvent (hydrophilic solvent) may be added to the raw colloidal silica, or the silane coupling agent is mixed in advance with the organic solvent (hydrophilic solvent) to obtain a mixture, and the mixture may be added to the raw colloidal silica. The latter method is more preferred. In addition, in JP 2010-269985 A, there is a description of "Considering the solubility of the coupling agent, it is preferred that the colloidal silica contains a hydrophilic organic solvent. In this regard, in a case where colloidal silica is obtained by a Stober method in which an alkoxysilane is hydrolyzed and condensed in an alcohol-water solvent with a basic catalyst, alcohol is contained in the reaction mixture, therefore, it is not required to further add a hydrophilic organic solvent." However, in the preferred embodiment of the present invention, a seemingly roundabout configuration in which the amount of the organic solvent contained in the raw colloidal silica obtained by a Stober method is once decreased to lower than the detection limit, and then the silane coupling agent is added is employed. According to the preferred embodiment of the present invention, even if the roundabout configuration as described above is employed, it has been found that the problem of the present invention can be solved. Therefore, in the present invention, it has been found that the action effects that is considered to be unpredictable by those skilled in the art are exerted in spite of employing the configuration contrary to the conventional technical common sense as described above. Accordingly, it can be said that the present invention is not an invention that could have been easily made by those skilled in the art who had been in contact with the description of particularly JP 2010-269985 A.

In addition, the addition amount of the silane coupling agent used in the first reaction step is not particularly limited, but is, relative to 100% by mass of the silica particles contained in the raw colloidal silica, preferably 0.5 to 10% by mass, more preferably 1 to 5% by mass, and furthermore preferably 1 to 3% by mass. When the addition amount of the silane coupling agent is 0.5% by mass or more, the surfaces of the silica particles can be sufficiently anionized, and an excellent performance can be exerted in a case of being used as a polishing agent (abrasive grains in a polishing composition). On the other hand, when the addition amount of the silane coupling agent is 10% by mass or less, gelation with time of the reactant (modified colloidal silica) to be obtained can be prevented. Further, the amount of the organic solvent (hydrophilic solvent) used for dissolving the silane coupling agent is, relative to 100% by mass of the silane coupling agent, preferably around 500 to 10000% by mass, and more preferably 1000 to 5000% by mass.

The temperature at which the silane coupling agent is added is not limited, but is preferably in the range of room temperature (around 20° C.) to the boiling point of the reaction solvent. The reaction time is not also limited, but is preferably 10 minutes to 10 hours, and more preferably 30 minutes to 5 hours. However, from the viewpoint of terminating the hydrolysis of the coupling agent, it is preferred that the first reaction step is performed under a condition that a temperature condition of 90° C. or more is continued for 30 minutes or more. The pH at the time of addition is also not limited, but is preferably 7 or more to 11 or less.

(Second Reaction Step)

In the second reaction step, the reactant (in which a silane coupling agent having a functional group chemically convertible to a sulfonic acid group is bonded to surfaces of silica particles), which has been obtained in the above-described first reaction step, is treated. As a result, the "functional group chemically convertible to a sulfonic acid group" possessed by the silane coupling agent is converted to a sulfonic acid group.

The specific form of the above-described "treatment" for converting the "functional group chemically convertible to a sulfonic acid group" possessed by the silane coupling agent to a sulfonic acid group is not particularly limited, and can be appropriately selected depending on the structure of the silane coupling agent to be used. For example, in the first reaction step, in a case where the above-described 1) a silane coupling agent having a sulfonic acid ester group convertible to a sulfonic acid group by hydrolysis is used, by subjecting the reactant to a hydrolysis treatment, the functional group (sulfonic acid ester group) possessed by the silane coupling agent can be hydrolyzed. As a result, the sulfonic acid ester group is converted to a sulfonic acid group.

Further, in the first reaction step, in a case where the above-described 2) a silane coupling agent having a mercapto group and/or a sulfide group convertible to a sulfonic acid group by oxidation is used, by subjecting the reactant to an oxidation treatment, the functional group (mercapto group and/or sulfide group) possessed by the silane coupling agent can be oxidized. As a result, the mercapto group or the sulfide group is converted to a sulfonic acid group.

In order to subject the reactant to an oxidation treatment, for example, the reactant may be reacted with an oxidizing agent. Examples of the oxidizing agent include nitric acid, hydrogen peroxide, oxygen, ozone, organic peracid (percarboxylic acid), bromine, hypochlorite, potassium permanganate, and chromic acid. Among these oxidizing agents, hydrogen peroxide and organic peracid (peracetic acid, and perbenzoic acids) are preferred in the point of being relatively easy to handle and being favorable in the oxidation yield. Further, in consideration of the substances by-produced in the reaction, it is most preferred to use hydrogen peroxide. From the viewpoint of ensuring the amount required for the reaction and decreasing the remaining oxidizing agent, the addition amount of the oxidizing agent is preferably 3 to 5 mol times the amount of the silane coupling agent. By adjusting the addition amount of the oxidizing agent to a value within such a range, the residual oxidizing agent concentration in the modified colloidal silica to be obtained can be minimized. The specific numerical value of the residual oxidizing agent concentration in the modified colloidal silica to be obtained is not particularly limited, but is preferably 1000 ppm by mass or less, more preferably 700 ppm by mass or less, and particularly preferably 500 ppm by mass or less. Herein, when the residual oxidizing agent concentration in the modified colloidal silica to be obtained exceeds 1000 ppm by mass, in storing and transporting the modified colloidal silica itself, or the polishing composition in which the modified colloidal silica have been added as a polishing agent (abrasive grains), in a state of being enclosed in a sealed container, there may be a case where an oxidizing agent such as hydrogen peroxide is decomposed, gas such as oxygen is generated, and the internal pressure of the container increases. On the other hand, as described above, by decreasing the residual oxidizing agent concentration in the modified colloidal silica to be obtained, the risk of such an increase of the internal pressure is reduced, therefore, this is preferred. Further, in a case of being used as a polishing composition, there is also an advantage that the occurrence of a problem such as wafer dishing, which can be generated when a large amount of oxidizing agent is contained, can be suppressed. In addition, as to the colloidal silica and the silane coupling agent, each of them has a structure that is stable in the oxidation reaction except for the functional groups to be oxidized (converted) to sulfonic acid groups, therefore, by-products are not present.

In a case where the modified colloidal silica obtained according to the above-described method contains a solvent other than water, in order to improve the long-term storage stability of the modified colloidal silica, the dispersing medium mainly containing a reaction solvent may be replaced with water as needed. In addition, this water replacement may be performed after the addition of the silane coupling agent and before the addition of the oxidizing agent. The method for replacing the solvent other than water with water is not particularly limited, and for example, a method in which water is added dropwise by a fixed amount while heating the modified colloidal silica can be mentioned. Further, a method in which the modified colloidal silica is separated from the solvent other than water by precipitation and separation, centrifugation, or the like, and then redispersed in water can also be mentioned.

(Cationically-Modified Colloidal Silica)

As described above, the present invention has been explained in detail by taking as an example the embodiment in which the modified colloidal silica is anionically modified with a sulfonic acid group, but the modified colloidal silica according to the present invention may be cationically modified (cationic modified colloidal silica). In order to obtain cationically-modified modified colloidal silica, in the similar manner as in the above, to the raw colloidal silica in which the content of microparticles is decreased, a silane coupling agent having an amino group or a quaternary cation group may be reacted under the similar conditions as those in the first reaction step.

At this time, examples of the silane coupling agent to be used include
N-(β-aminoethyl)-γ-aminopropylmethyldimethoxysilane,
N-(β-aminoethyl)-γ-aminopropyltrimethoxysilane,
N-(β-aminoethyl)-γ-aminopropyltriethoxysilane,
γ-aminopropyltriethoxysilane,
γ-aminopropyltrimethoxysilane,
γ-triethoxysilyl-N-(α,γ-dimethyl-butylidene)propylamine,
N-phenyl-γ-aminopropyltrimethoxysilane, hydrochloride of N-(vinylbenzyl)-β-aminoethyl-γ-aminopropyltriethoxysilane and octadecyl dimethyl-(γ-trimethoxysilylpropyl)- ammonium chloride. Among them, since the reactivity with the colloidal silica is favorable, N-(β-aminoethyl)-γ-aminopropyltrimethoxysilane, N-(β-aminoethyl)-γ-aminopropyltriethoxysilane, γ-aminopropyltriethoxysilane, and γ-aminopropyltrimethoxysilane are preferably used. Further, in the present invention, the silane coupling agent may be used singly alone or may be used in combination of two or more kinds thereof.

The modified colloidal silica according to the present invention has a small content of the microparticles including the silica particles of which the surfaces are modified (anionically modified or cationically modified). When expressing this quantitatively, according to the present invention, the following two forms are further provided depending on the type of the modification treatment.

Modified colloidal silica being anionically modified, in which when a SiN wafer is subjected to an immersion treatment under a pH 2 condition and then washed with pure water, the number of the particles having a particle size of less than 40% of a volume average particle size adhering to a surface of the SiN wafer is 50% or less relative to the number of the particles having a particle size of 40% or more of a volume average particle size adhering similarly; and Modified colloidal silica being cationically modified, in which when an aluminosilicate glass wafer is subjected to an immersion treatment under a pH 4 condition and then washed with pure water, the number of the particles having a particle size of less than 40% of a volume average particle size adhering to a surface of the aluminosilicate glass wafer is 50% or less relative to the number of the particles having a particle size of 40% or more of a volume average particle size adhering similarly.

The above-described proportion is preferably 30% or less, more preferably 10% or less, and furthermore preferably 5% or less. On the other hand, the lower limit value of this proportion is not particularly limited, but is, for example, 0.1% or more. Further, the measurement method of this proportion is as follows (regarding the anionically modified colloidal silica, the measurement method is described as "condition 8" also in a section of Examples).

(Adhesion Observation Test of SiN Wafer for Anionic Modified Colloidal Silica)
Apparatus: Scanning electron microscope SU 8000 (manufactured by Hitachi High-Technologies Corporation)
Procedures: The obtained anionic modified colloidal silica is diluted to have a silica concentration of 14% by mass and adjusted to pH 2 with a pH adjusting agent. A SiN wafer is immersed for 10 seconds, and then shaken in pure water for 30 seconds. Subsequently, the SiN wafer is dried thoroughly with $N_2$ gas, and then ten viewing fields are observed at a magnification of 100000 times using a scanning electron microscope SU 8000.

(Adhesion Observation Test of Aluminosilicate Glass Wafer for Cationic Modified Colloidal Silica)
Apparatus: Scanning electron microscope SU 8000 (manufactured by Hitachi High-Technologies Corporation)
Procedures: The obtained cationic modified colloidal silica is diluted to have a silica concentration of 1% by mass and adjusted to pH 4 with a pH adjusting agent. An aluminosilicate glass wafer is immersed for 10 seconds, and then shaken in pure water for 30 seconds. Subsequently, the aluminosilicate glass wafer is dried thoroughly with $N_2$ gas, and then ten viewing fields are observed at a magnification of 100000 times using a scanning electron microscope SU 8000.

In addition, in the above-described adhesion observation test, since the interval between adhered particles differs depending on the particle size of silica particles, when the test is performed, the silica concentration in the colloidal silica can be arbitrarily changed so that the observation is easily performed, and this change has no effect on the measurement results.

Further, the modified colloidal silica obtained by the production method of the present invention is preferred also in the point that the content of metal impurities is reduced. Herein, examples of the metal impurities include an alkali metal such as sodium, and potassium; an alkaline earth metal such as calcium, and magnesium; and a heavy metal or light metal such as aluminum, iron, titanium, nickel, chromium, copper, zinc, lead, silver, manganese, and cobalt. In the modified colloidal silica according to the preferred embodiment of the present invention, the total content of the metal impurities is 1 ppm by mass or less. The total content is preferably 0.5 ppm by mass or less. In addition, the method for measuring the total content of the metal impurities is performed in accordance with the description in Examples described later. Further, the modified colloidal silica is preferred because of containing no corrosive halogen element such as chlorine, and bromine.

The particle size of the silica particles contained in the modified colloidal silica according to the present invention is not particularly limited, and is for example, 1000 nm or less, preferably 5 to 500 nm, and more preferably 10 to 300 nm. In addition, the particle size of the silica particles means the volume average particle size based on Heywood diameter (equivalent circle diameter) as measured by the technique described in Examples described later.

The modified colloidal silica according to the present invention is excellent in the long-term dispersion stability in a wide pH range. The stability of the silica sol can be evaluated by measuring the zeta potential of the silica sol. The zeta potential is a potential difference generated at the interface between solid and liquid, which are in contact with each other, when the solid and the liquid are moved relatively to each other. As the absolute value of the zeta potential increases, the repulsion between the particles becomes stronger and the stability of the particles becomes higher, and as the absolute value of the zeta potential approaches zero, the particles tend to aggregate more easily.

In particular, among the modified colloidal silica according to the present invention, the anionically-modified modified colloidal silica has high stability in the acidic region. Since a coupling agent having an anionic group is used as a modifier when the anionically-modified modified colloidal silica is obtained, the zeta potential is negative potential (−15 mV or less) when the dispersing medium is under an acidic condition of pH 2 or more, and even if the dispersing medium is under an acidic condition, the dispersion stability is high. As described above, since the absolute value of the zeta potential is large, the dispersion stability is high, and along with this, the kinematic viscosity of the modified colloidal silica is also small.

The modified colloidal silica according to the present invention can be used for various applications, such as a polishing agent (abrasive grains) contained in a polishing composition, and a paper coating agent, and can be stably dispersed for a long time in a wide pH range. As described above, when the modified colloidal silica according to the present invention, in which the proportion of the microparticles adhering to a wafer is kept low, is used particularly as a polishing agent (abrasive grains) for CMP polishing of a semiconductor wafer, the fluctuation with time of the polishing speed can be minimized (excellent in the stability with time), therefore, the modified colloidal silica is extremely suitably used for the applications, and can sufficiently cope also with the high performance requirements accompanying the miniaturization.

EXAMPLES

The present invention will be described in more detail using the following Examples and Comparative Examples. However, the technical scope of the present invention is not limited only to the following Examples.

Example 1

In a flask, 4080 g of methanol, 610 g of water, and 168 g of 29% by mass ammonia aqueous solution were mixed, the temperature of the resultant mixture was kept at 20° C., and into the mixture, a mixture of 135 g of methanol and 508 g of tetramethoxysilane (TMOS) was added dropwise over 25 minutes. After that, the resultant mixture was subjected to heat concentration and water replacement under a condition of pH 7 or more, and 1000 g of 19.5% by mass silica sol was obtained. It was confirmed by gas chromatography (the following condition 1) that the methanol concentration at that time was less than 1% by mass (lower than the detection limit).

(Condition 1: Measurement Conditions for Methanol Concentration Using Gas Chromatography)
Apparatus: Gas chromatography GC-14B (manufactured by Shimadzu Corporation)
Measurement: 4 of a sample is taken out using a 10 μL syringe and injected to the apparatus. The methanol concentration is calculated from the amount of moisture and the amount of methanol, which are obtained in the measurement.

Figure 2:
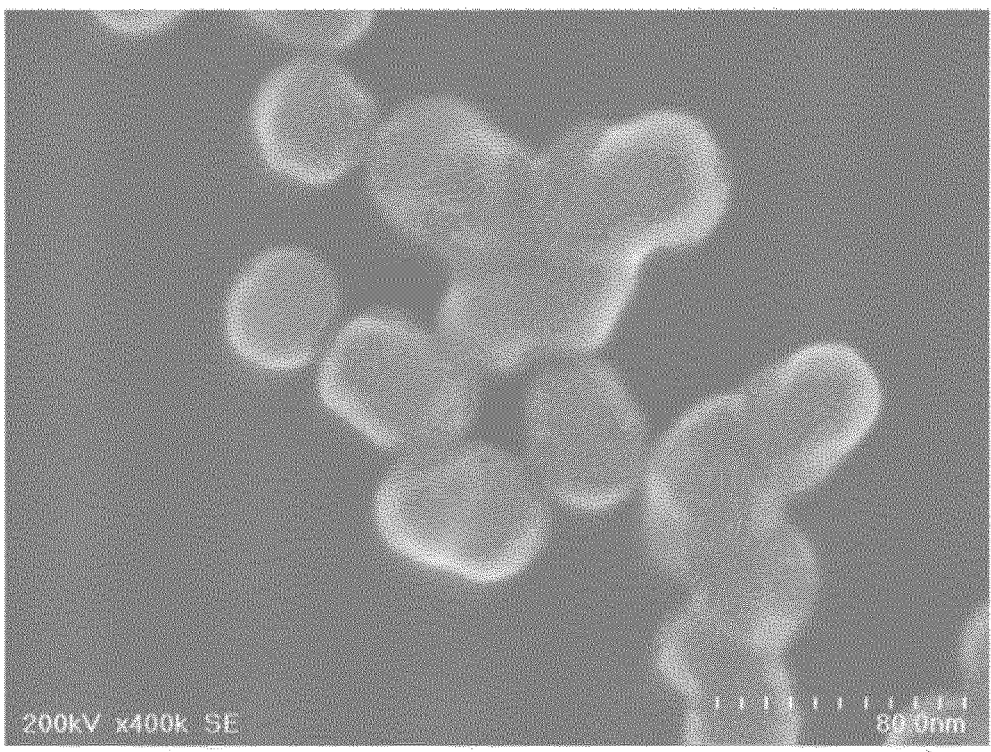
FIG. 2 is a picture of sulfonic acid-modified colloidal silica obtained in Example 1, observed with a transmission electron microscope (TEM) (magnification: 400000 times).

On the other hand, the silica sol obtained by the above procedure was observed with a scanning electron microscope (SEM) (the following condition 2) (FIG. 1), and when the particle size distribution was analyzed by using image analysis software (the following condition 3) based on the SEM picture, the number distribution ratio of the microparticles having a size of 40% or less of the volume average particle size by SEM image analysis was less than 1%. In addition, when the surface state of the silica particles was observed with a transmission electron microscope (TEM) (the following condition 4), the surface of the silica particles showed a smooth state (FIG. 2).

(Condition 2: Conditions for SEM Observation)
Apparatus: Scanning electron microscope S4700 (manufactured by Hitachi High-Technologies Corporation)
Procedures: The sample, which is obtained by dispersing silica sol in an organic solvent and subjecting the resultant mixture to dry-solidifying on a sample table, is placed on the main body of the apparatus, and irradiated with an electron beam at 12 kV by the apparatus, and then ten viewing fields are observed at a magnification of 100000 times.

(Condition 3: Conditions for Image Analysis Based on SEM Picture)
Apparatus: Image analysis software MacView Ver. 4 (manufactured by Mountech Co., Ltd.)
Procedures: Using the taken SEM picture, 500 particles are counted by the apparatus. After that, the volume average particle size based on Heywood diameter (equivalent circle diameter) is calculated, and the particle size distribution in terms of the proportion of the number of particles is calculated.

(Condition 4: Conditions for TEM Observation)
Apparatus: Transmission electron microscope HD-2700 (manufactured by Hitachi High-Technologies Corporation)
Procedures: Silica sol is dispersed in an organic solvent, the resultant mixture is added dropwise on a surface of dedicated Cu mesh and dry-solidified, the dry-solidified sample is irradiated with an electron beam at 200 kV by the apparatus, and then ten viewing fields are observed at a magnification of 400000 times.

Subsequently, into 1000 g of the silica sol obtained in the above procedure, 1.7 g of 29% by mass ammonia water was added to lower the viscosity, and into the resultant mixture, 2.5 g of 3-mercaptopropyl trimethoxysilane (product name: KBM-803, manufactured by Shin-Etsu Chemical Co., Ltd.) separately mixed with 22.5 g of methanol was added dropwise at a flow rate of 5 mL/min, and then the resultant mixture was heated, after the boiling, water replacement was performed for 6 hours. It was confirmed by the similar technique as in the above (gas chromatography method) that the methanol concentration at that time was a value outside the detection limit.

Next, the reaction mixture was once cooled down to 25° C., and then into the cooled mixture, 4.2 g of 31% by mass hydrogen peroxide water was added, and the resultant mixture was boiled again. After the boiling, water replacement was performed for 4 hours, and then the resultant mixture was cooled down to room temperature, and the sulfonic acid (anionic) modified colloidal silica of the present Example was obtained.

The amount of the impurities of 13 metal elements in the modified colloidal silica thus obtained was measured by the metal impurity concentration measurement (the following condition 5) using an inductively coupled plasma (ICP) emission spectrometer, and in addition, the amount of the supernatant Si in the obtained modified colloidal silica was measured by the supernatant Si concentration measurement (the following condition 6) using an inductively coupled plasma (ICP) emission spectrometer. Note that the supernatant Si concentration is a value obtained by measuring the supernatant, which has been obtained by centrifuging the modified colloidal silica, using an inductively coupled plasma (ICP) emission spectrometer, and the fact that this value varies over time means that aggregation of microparticles and incorporation of microparticles to large particles are generated, and the physical properties are changed.

Further, a test of the SiN polishing speed was performed with a 300 mm CMP one-side polishing device (manufactured by Ebara Corporation) (the following condition 7).

In addition, an adhesion test on the SiN wafer was also performed, and the adhered wafer was observed by using a scanning electron microscope (manufactured by Hitachi High-Technologies Corporation) (the following condition 8). Further, the proportion of the number of small particles was analyzed based on the SEM picture (the above condition 3).

In addition, by the particle size distribution analysis based on the SEM picture using a scanning electron microscope (SEM), and by the surface shape observation at high magnification using a transmission electron microscope (TEM), the verification of the physical properties of the finished product was performed. From the results of the surface shape observation with TEM, changes in the surface characteristics of the silica particles were not observed even after performing the first and the second reaction steps.

(Condition 5: Conditions for Metal Impurity Concentration Measurement Using ICP Emission Spectrometer)
Measuring apparatus:
Ni and Cu: Agilent 7500cs ICP-MS (manufactured by Agilent Technologies, Inc.)
Metals other Ni and Cu: ICPS-8100 (manufactured by Shimadzu Corporation)
Procedures: 10 ml of a sample is collected, into the collected sample, 3 ml of nitric acid and 10 ml of hydrofluoric acid are added, and the resultant mixture is evaporated and dry-solidified. After the dry-solidifying, 0.5 ml of nitric acid and around 20 ml of ultrapure water are added, and the resultant mixture is heated until steam is generated. The whole amount is collected, adjusted to 50 g with ultrapure water, and measurements are performed by using each of the above apparatuses.

(Condition 6: Conditions for Supernatant Si Concentration Measurement Using ICP Emission Spectrometer)
Centrifugal device: High-performance high-speed refrigerated centrifuge, Avanti HP-30I (manufactured by Beckman Coulter, Inc.)
ICP measuring apparatus: ICP-AES SPS3510 (manufactured by Hitachi High-Tech Science Corporation)
Procedures: Modified colloidal silica is placed in a dedicated resin tube, and centrifugation is performed at 26000 rpm for 2 hours. Subsequently, a calibration curve is drawn with Si standard samples of 0, 25, 50, and 75 ppm by ICP-AES, 1 g of the supernatant after the centrifugation is collected, and diluted with ultrapure water by 20 times, and then measurement is performed by the apparatus.

(Condition 7: Test Conditions for SiN Polishing Speed by 300 mm CMP One-Side Polishing Device)
Apparatus: 300 mm CMP one-side polishing device (manufactured by Ebara Corporation)
Polishing pad: polyurethane foam
Polishing wafer: 300 mm SiN bare wafer
Rotation speed: 60 rpm
Pressure: 70 hPa
Slurry flow rate: 300 mL/min
Polishing time: 60 sec
Polishing speed [Å/min]=Amount of the change in film thickness when polished for 1 minute
The polishing speed was calculated by dividing each wafer thickness difference by the polishing time, the each wafer thickness difference was obtained by measuring before and after the polishing by using an optical interference-type film thickness measuring device.

(Condition 8: Adhesion Observation Test of SiN Wafer)
Apparatus: Scanning electron microscope SU 8000 (manufactured by Hitachi High-Technologies Corporation)
Procedures: The obtained modified colloidal silica is diluted to have a silica concentration of 14% by mass and adjusted to pH 2 with a pH adjusting agent. A SiN wafer is immersed for 10 seconds, and then shaken in pure water for 30 seconds. Subsequently, the SiN wafer is dried thoroughly with $N_2$ gas, and then ten viewing fields are observed at a magnification of 100000 times using a scanning electron microscope SU 8000.

Comparative Example 1

Corresponding to Example 1 of JP 2010-269985 A

Into a mixture of 551.5 g of pure water, 550.2 g of 26% by mass ammonia water, and 9047 g of methanol in a flask, a mixture of 1065.5 g of tetramethoxysilane (TMOS), and 289.1 g of methanol was added dropwise over 55 minutes while maintaining the mixture temperature at 35° C., as a result of which silica sol containing water and methanol as a dispersing medium was obtained.

Figure 3:
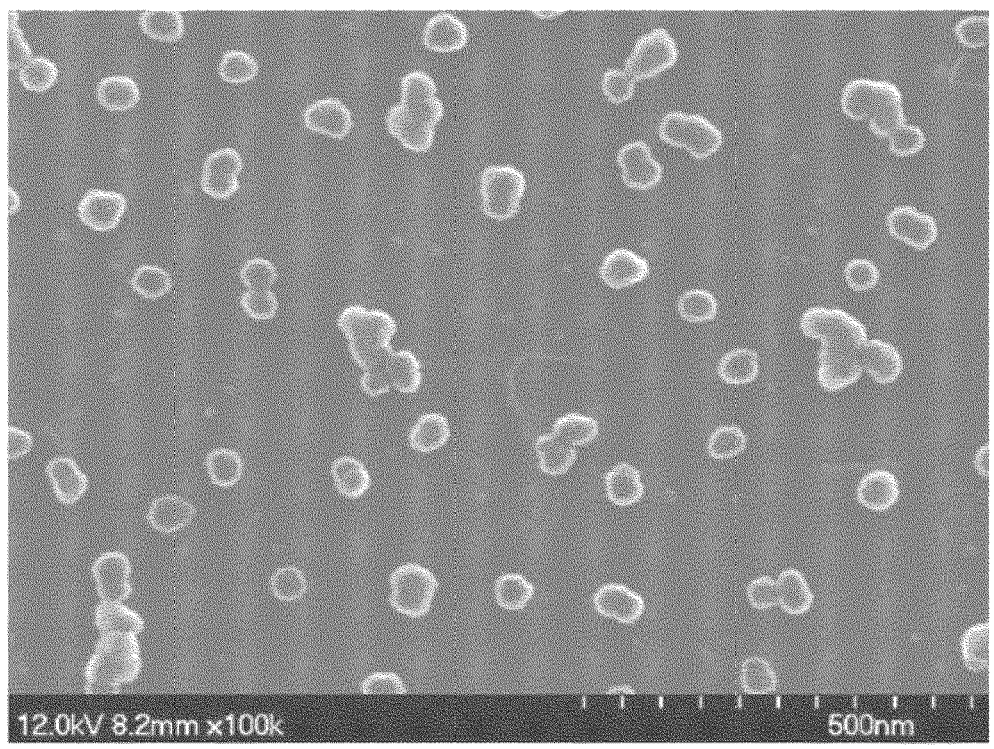
FIG. 3 is a picture of sulfonic acid-modified colloidal silica obtained in Comparative Example, 1 observed with a scanning electron microscope (SEM) (magnification: 100000 times).
Figure 4:
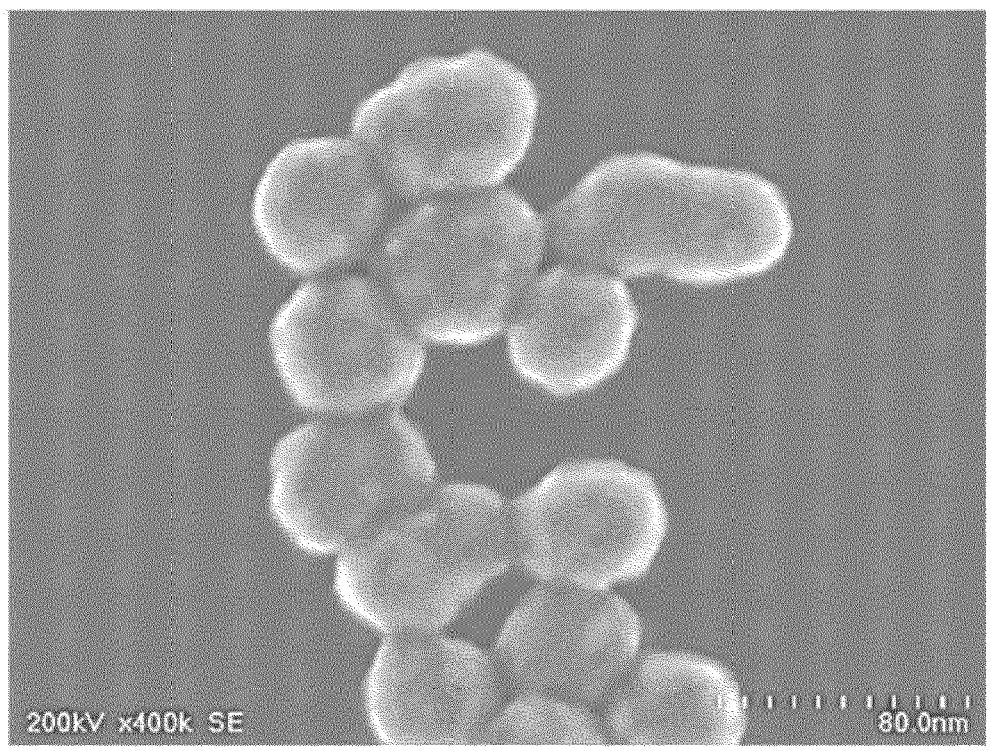
FIG. 4 is a picture of sulfonic acid-modified colloidal silica obtained in Comparative Example 1, observed with a transmission electron microscope (TEM) (magnification: 400000 times).

The silica sol obtained in the above procedure was heated and concentrated to 3500 mL under normal pressure. When the methanol concentration of the mixture was measured in the similar manner as in the above, 71% by mass was obtained. Further, the silica sol obtained in the above procedure was observed using a scanning electron microscope (SEM) in the similar manner as in the above (FIG. 3), and when the particle size distribution was analyzed by using image analysis software based on the SEM picture, the number distribution ratio of the microparticles having a size of 40% or less of the volume average particle size by SEM image analysis was 47.6%. In addition, when the surface state of the silica particles was observed with a transmission electron microscope (TEM) in the similar manner as in the above, existence of an uneven state was confirmed on the surfaces of the silica particles (FIG. 4).

Subsequently, into 3500 mL of the silica sol obtained in the above, 24.2 g of 3-mercaptopropyl trimethoxysilane (product name: KBM-803, manufactured by Shin-Etsu Chemical Co., Ltd.) was added, and the resultant mixture was refluxed at a boiling point and heat-aged. After that, methanol and ammonia were replaced with water while adding pure water in order to keep the capacity constant, and when the pH became 8 or less, the temperature of the silica sol was once lowered to room temperature. Next, into the resultant silica sol, 37.5 g of 35% by mass hydrogen peroxide water was added, and the resultant mixture was heated again, the reaction was continued for 8 hours, and the resultant mixture was cooled down to room temperature, subsequently modified colloidal silica of the present Comparative Example was obtained.

As to the modified colloidal silica thus obtained, in the similar manner as in the above, the amount of the impurities of 13 metal elements was measured by the metal impurity concentration measurement using an inductively coupled plasma (ICP) emission spectrometer, and in addition, the amount of the supernatant Si in the obtained modified colloidal silica was measured by the supernatant Si concentration measurement using an inductively coupled plasma (ICP) emission spectrometer.

Further, in the similar manner as in the above, a test of the SiN polishing speed was performed using a 300 mm CMP one-side polishing device (manufactured by Ebara Corporation).

Subsequently, an adhesion test on the SiN wafer was also performed, and the adhered wafer was observed by using a scanning electron microscope (manufactured by Hitachi High-Technologies Corporation). Further, the proportion of the number of small particles based on the SEM picture was analyzed.

In addition, in the similar manner as in the above, by the particle size distribution analysis from the SEM picture with a scanning electron microscope (SEM), and by the surface observation using a transmission electron microscope (TEM), the verification of the physical properties of the finished product was performed. From the results of the surface observation with TEM, changes in the surface characteristics of the silica particles were not observed even after performing the first and the second reaction steps.

Comparative Example 2

Figure 5:
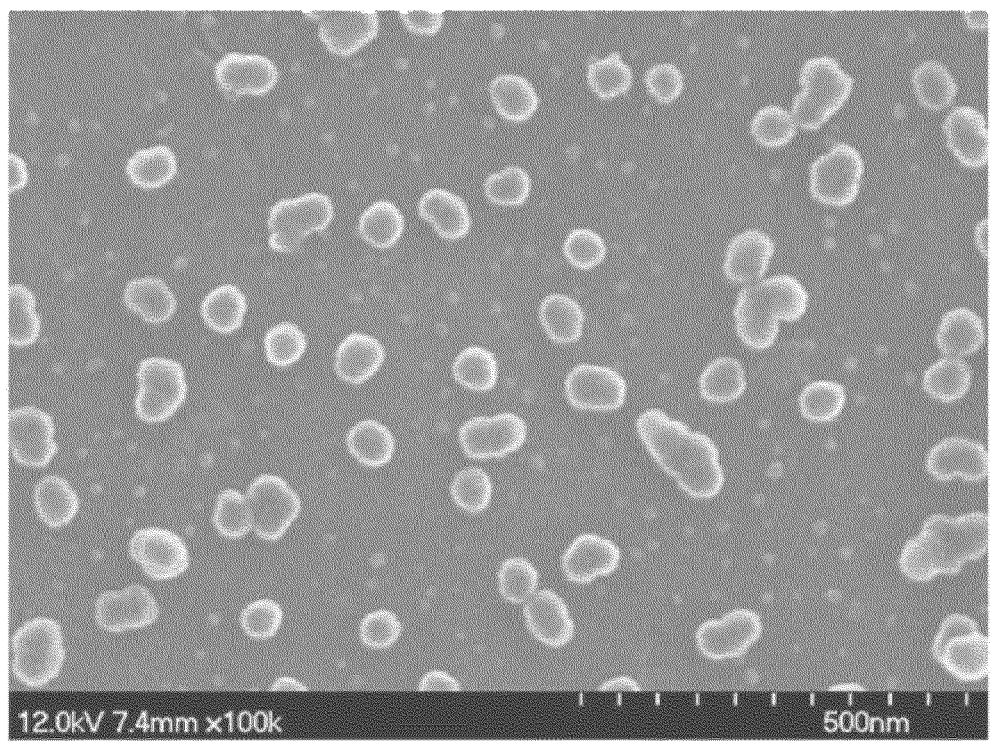
FIG. 5 is a picture of sulfonic acid-modified colloidal silica obtained in Comparative Example 2, observed with a scanning electron microscope (SEM) (magnification: 100000 times).
Figure 6:
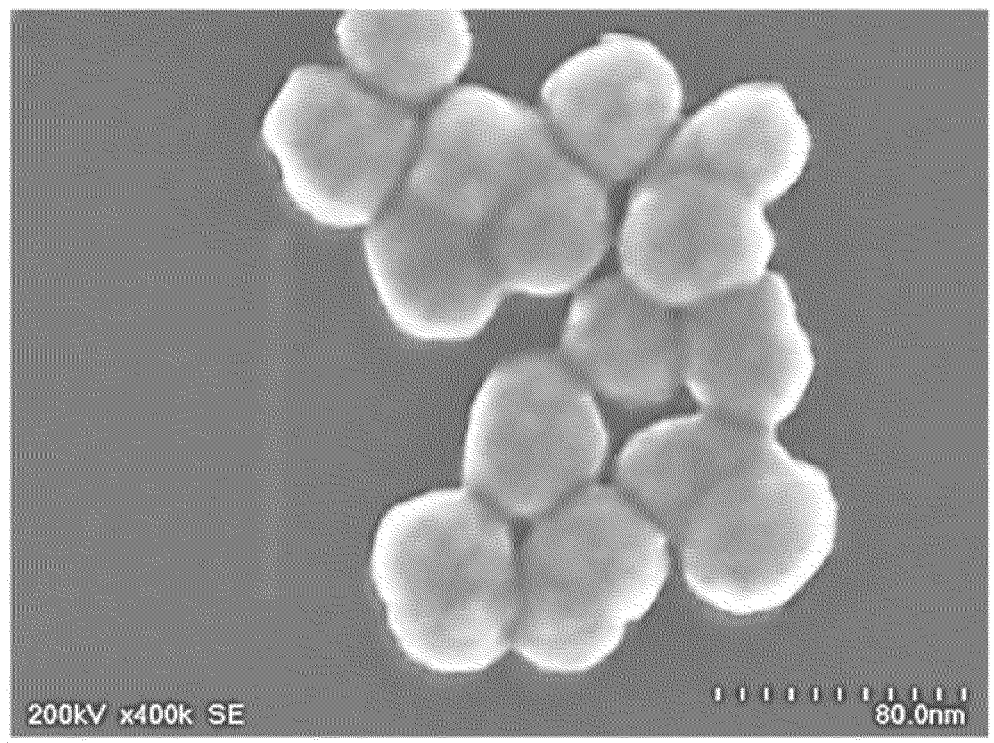
FIG. 6 is a picture of sulfonic acid-modified colloidal silica obtained in Comparative Example 2, observed with a transmission electron microscope (TEM) (magnification: 400000 times).

Into a mixture of 133 g of pure water, 64.8 g of 29% by mass ammonia water, and 1223 g of methanol, a mixture of 1015 g of tetramethoxysilane (TMOS) and 76 g of methanol, and 239 g of pure water were simultaneously added dropwise over 150 minutes while maintaining the mixture temperature at 35° C., as a result of which silica sol containing water and methanol as a dispersing medium was obtained. When the methanol concentration of the mixture was measured in the similar manner as in the above procedure, 65% by mass was obtained. Further, the silica sol obtained in the above procedure was observed using a scanning electron microscope (SEM) (FIG. 5), and when the particle size distribution was analyzed by using image analysis software based on the SEM picture, the number distribution ratio of the microparticles having a size of 40% or less of the volume average particle size by SEM image analysis was 83.9%. In addition, when the surface state of the silica particles was observed with a transmission electron microscope (TEM) in the similar manner as in the above procedure, existence of an uneven state was confirmed on the surfaces of the silica particles (FIG. 6).

Subsequently, into the silica sol obtained in the above procedure (around 2000 g in terms of 19.5% by mass), 5.0 g of 3-mercaptopropyl trimethoxysilane (product name: KBM-803, manufactured by Shin-Etsu Chemical Co., Ltd.) mixed with 45.0 g of methanol was added dropwise at a flow rate of 5 mL/min, and then the resultant mixture was heated, methanol and ammonia were replaced with water while adding pure water in order to keep the capacity constant, and when the pH became 8 or less, the temperature of the silica sol was once lowered to room temperature. After the resultant silica sol was cooled down to room temperature, into the cooled silica sol, 8.4 g of 31% by mass hydrogen peroxide water was added, and the resultant mixture was boiled again. After the boiling, water replacement was performed for 4 hours, and then the resultant mixture was cooled down to room temperature, as a result of which modified colloidal silica of the present Comparative Example was obtained.

As to the modified colloidal silica thus obtained, in the similar manner as in the above procedure, the amount of the impurities of 13 metal elements was measured by the metal impurity concentration measurement using an inductively coupled plasma (ICP) emission spectrometer, and in addition, the amount of the supernatant Si in the obtained modified colloidal silica was measured by the supernatant Si concentration measurement using an inductively coupled plasma (ICP) emission spectrometer.

Further, in the similar manner as in the above procedure, a test of the SiN polishing speed was performed using a 300 mm CMP one-side polishing device (manufactured by Ebara Corporation).

Subsequently, an adhesion test on the SiN wafer was also performed, and the adhered wafer was observed by using a scanning electron microscope (manufactured by Hitachi High-Technologies Corporation). Further, the proportion of the number of small particles based on the SEM picture was analyzed.

In addition, in the similar manner as in the above procedure, by the particle size distribution analysis based on the SEM picture using a scanning electron microscope (SEM), and by the surface observation using a transmission electron microscope (TEM), the verification of the physical properties of the finished product was performed. From the results of the surface observation with TEM, changes in the surface characteristics of the silica particles were not observed even after performing the first and the second reaction steps.

TABLE 1

| | Physical properties of silica particles before addition of coupling agent | | Physical properties of silica particles after completion of modified colloidal silica | | Immediately after production | | After high temperature acceleration test at 80° C. for 1 week | | Physical properties/ rate change |
|---|---|---|---|---|---|---|---|---|---|
| | number percentage of microparticles [%] | Methanol concentration [% by mass] | Number distribution in SiN wafer adhesion [%] | Surface shape of silica particle | Supernatant Si [ppm] | ratio of SiN polishing rates [%] | Supernatant Si [ppm] | SiN polishing speed ratio [%] | |
| Example 1 | 0.17 | <1 (Not detected) | 0.15 | Smooth | 200 | 100 (Reference value) | 200 | 100 | No |
| Comparative Example 1 | 47.6 | 71 | 65.3 | Uneven | 700 | 104 | 400 | 92 | Yes |
| Comparative Example 2 | 83.9 | 65 | 88.2 | Uneven | 2000 | 92 | 1700 | 88 | Yes |

From the results shown in Table 1, the modified colloidal silica of Example 1 produced by the production method according to the present invention showed smooth surface shape of silica particles, and the amount of the microparticles adhering to the SiN wafer was largely reduced. In addition, the amount of the supernatant Si (depending on the amount of microparticles) contained in the obtained modified colloidal silica was also reduced, and further, the amount of supernatant Si did not change also over time. As a result, it was confirmed that the ratio of the SiN polishing rates also does not change over time, and the modified colloidal silica is excellent extremely in the stability with time.

On the other hand, the modified colloidal silica produced by the production methods of Comparative Examples 1 and 2 had unevenness on the surfaces of the silica particles, and the amount of the microparticles adhered to the SiN wafer was also large. In addition, the amount of the supernatant Si contained in the obtained modified colloidal silica was also large, and further, the amount of supernatant Si changed over time. As a result, it was confirmed that the ratio of the SiN polishing rates also fluctuated largely over time, and this resulted in being inferior in the stability with time.

Further, the measurement results of the above-described metal impurity amount are shown in the following Table 2.

TABLE 2

Unit: ppb by mass

| | Example 1 | Comparative Example 1 | Comparative Example 2 |
|---|---|---|---|
| Ni | 0.1 | 0.1 | 0.2 |
| Cu | <0.05 | <0.05 | <0.05 |

TABLE 2-continued

Unit: ppb by mass

|    | Example 1 | Comparative Example 1 | Comparative Example 2 |
|----|-----------|----------------------|----------------------|
| Zn | <5        | <5                   | <5                   |
| Ag | <3        | <3                   | <3                   |
| Al | <5        | <5                   | <5                   |
| Ca | 2.1       | 1.9                  | 1.7                  |
| Cr | <5        | <5                   | <5                   |
| Fe | <10       | <10                  | <10                  |
| K  | <55       | <55                  | <55                  |
| Mg | <3        | <3                   | <3                   |
| Na | 12.6      | 13.2                 | 12.4                 |
| Pb | <14       | <14                  | <14                  |
| Ti | <5        | <5                   | <5                   |

From the results shown in Table 2, it can be understood that the modified colloidal silica according to the present invention has an extremely small content of metal impurities.

This application is based on Japanese Patent Application No. 2015-008049, filed with the Japan Patent Office on Jan. 19, 2015, the entire content of which is hereby incorporated by reference.

The invention claimed is:

1. Modified colloidal silica comprising a residual oxidizing agent, being obtained by anion-modifying unmodified colloidal silica, wherein the unmodified colloidal silica has a number distribution ratio of 10% or less of microparticles having a particle size of 40% or less relative to a volume average particle size based on Heywood diameter (equivalent circle diameter) as determined by image analysis using a scanning electron microscope, and wherein a residual oxidizing agent concentration in the modified colloidal silica is 1000 ppm by mass or less.

2. The modified colloidal silica according to claim 1, wherein the modified colloidal silica is modified with a sulfonic acid group.

3. Modified colloidal silica being anionically modified, comprising a residual oxidizing agent, wherein when a SiN wafer is subjected to an immersion treatment under a pH 2 condition and then washed with pure water, the number of particles having a particle size of less than 40% of a volume average particle size adhering to a surface of the SiN wafer is 50% or less relative to the number of particles having a particle size of 40% or more of a volume average particle size adhering similarly, and wherein a residual oxidizing agent concentration in the modified colloidal silica is 1000 ppm by mass or less.

4. The modified colloidal silica according to claim 3, wherein the total content of metal impurities is 1 ppm by mass or less.

5. A polishing agent, comprising the modified colloidal silica set forth in claim 1.

6. A polishing agent, comprising the modified colloidal silica set forth in claim 2.

7. A polishing agent, comprising the modified colloidal silica set forth in claim 3.

8. A polishing agent, comprising the modified colloidal silica set forth in claim 4.

* * * * *